US007205866B2

(12) United States Patent
Chiang

(10) Patent No.: US 7,205,866 B2
(45) Date of Patent: Apr. 17, 2007

(54) ELECTRONIC PHASE REFLECTOR WITH ENHANCED PHASE SHIFT PERFORMANCE

(75) Inventor: Bing Chiang, Melbourne, FL (US)

(73) Assignee: IPR Licensing, Inc., Wilmington, DE (US)

( * ) Notice: Subject to any disclaimer, the term of this patent is extended or adjusted under 35 U.S.C. 154(b) by 0 days.

(21) Appl. No.: 11/169,173

(22) Filed: Jun. 28, 2005

(65) Prior Publication Data

US 2005/0270123 A1 Dec. 8, 2005

Related U.S. Application Data

(63) Continuation-in-part of application No. 11/022,483, filed on Dec. 22, 2004, now Pat. No. 6,992,546, which is a continuation of application No. 10/691, 198, filed on Oct. 22, 2003, now Pat. No. 6,911,879, which is a continuation of application No. 09/774, 534, filed on Jan. 31, 2001, now Pat. No. 7,015,773.

(51) Int. Cl.
*H01P 3/00* (2006.01)
*H03H 7/38* (2006.01)

(52) U.S. Cl. .......................... 333/164; 333/33; 333/35

(58) Field of Classification Search ........ 333/156–164, 333/17.3, 263, 32–35
See application file for complete search history.

(56) References Cited

U.S. PATENT DOCUMENTS 4,450,419 A * 5/1984 Schwarzmann ............. 333/164

* cited by examiner

*Primary Examiner*—Robert Pascal
*Assistant Examiner*—Kimberly E Glenn
(74) *Attorney, Agent, or Firm*—Volpe and Koenig, P.C.

(57) ABSTRACT

A varactor based phase shifter that increases phase shift range using an impedance transformer to impart a low characteristic impedance between an input port and a reference node port. The characteristic impedance across the port is therefore less than the characteristic impedance would be otherwise, and the phase shift range is increased. In one embodiment, a simple reflection phase modifier can be used in a phased array using space feed parasitic antenna elements. This type of analog varactor reflection phase modifier can provide fine phase resolution, and the array can thus be used for low-loss adaptive beam forming.

20 Claims, 7 Drawing Sheets

ELECTRONIC PHASE REFLECTOR WITH ENHANCED PHASE SHIFT PERFORMANCE

RELATED APPLICATION

This application is a continuation-in-part of U.S. patent application Ser. No. 11/022,483, filed Dec. 22, 2004, now U.S. Pat. No. 6,992,546, which is a continuation of U.S. patent application Ser. No. 10/691,198, filed Oct. 22, 2003, now U.S. Pat. No. 6,911,879, which is a continuation of U.S. patent application Ser. No. 09/774,534, filed Jan. 31, 2001, now U.S. Pat. No. 7,015,773. The entire teachings of the above reference applications are incorporated herein by reference.

BACKGROUND OF THE INVENTION

An emerging class of consumer electronic devices are wireless data access units that permit, for example, a portable laptop computer to be connected to a data network using radio waves. Ideally, such access devices take the form factor of a small handheld unit, much in the nature of the well-known cellular mobile telephone handsets. Because the users of such systems demand the highest data rate possible, given a specific available bandwidth for providing the service, these units are increasingly being designed to take advantage of sophisticated antenna techniques.

These techniques involve typically the use of antenna arrays that permit the radio link between the access unit and a centralized network base station to be made over a directional or diverse connection. The directivity provided by an antenna array reduces interference generated by a given radio connection with connections made to other access units operating within the same region, or cell, serviced by a particular base station. In order to accomplish the required directivity of the antenna array a number of components may be used to create the antenna beam. This may include switches, delay circuits, or phase shifters; the phase shifters provide the maximum control over the direction and shape of the resulting beam.

It becomes desirable therefore to provide for phase shifters that are as efficient, low-loss, and provide as wide a phase shift range as possible. Ideally, such phase shifter circuits are constructed using planar circuit techniques so that they may be as small and as inexpensive as possible. These requirements are critical if such phase shifters are to be effectively and economically deployed in portable access unit equipment.

At operating frequencies in the Very High Frequency (VHF) and higher frequency bands, one such circuit design makes use of a four port directional coupler. This design uses one or more varactors coupled to quadrature ports of the directional coupler. If the directional coupler is a half power, i.e., three decibel (dB) coupler, the reflections from the quadrature port(s) are equally recombined at the fourth output port. The signals combined at the output port will have a phase that is quasi-proportional to the impedance phase angle of the varactor(s). Thus, the amount of phase shift provided is a monotonic function that varies as the inverse of the line impedance.

SUMMARY OF THE INVENTION

The present invention is an improvement to a class of varactor based phase shifters that provides an increase in phase shift range and a reduction in the circuit requirements of the varactor components.

Briefly, the invention makes use of the property that a lower line impedance will provide greater phase shift, relying a unique technique to realize the lower line impedance. The technique used to achieve lower impedance is to embed a quarter-wave impedance transformer into the circuit, without adding extra signal path line lengths.

For example, if the input to output impedance is 50 ohms, which is the standard instrumentation line impedance, the impedance transformer implements a 50 ohm to 20 ohm transformation. In this embodiment, the impedance transformer may take the form of a pair of circuit traces. The first circuit trace runs from the input port to a quadrature port, and has a width that presents a 22 ohm impedance and a length that approximates one-quarter wavelength at the operating frequency. The 22 ohms is determined from the equation $$\sqrt{Z_{O1}Z_{O2}}/F_{QC}$$

where $Z_{01}$ is the input-output port impedance (50 ohms), $Z_{02}$ is the quadrature port impedance (20 ohms), and $F_{QC}$ is a quadrature hybrid coupler factor. In the case of a branch line coupler, $F_{QC}$ is equal to $\sqrt{2}$.

The second circuit trace, running from the second quadrature port to the output port, is similarly formed from a conductive path that presents the 22 ohm transform impendence, and a length also of the desired one-quarter wavelength.

The quadrature ports each have attached thereto a varactor diode. The varactor diodes are biased by an input control voltage applied to the quadrature ports.

Coupling between the input/output port and between the quadrature ports may be provided by a circuit trace a quarter wave long connected between the respective ports. In the case of the input to output port, the circuit trace carries the characteristic desired 50 ohm impedance. Between the quadrature ports, the circuit trace provides the 20 ohm impedance desired across the quadrature ports.

In an alternative arrangement, quarter wave long face-coupled lines may provide the desired coupling between the input and output ports as well as between the coupling between quadrature ports.

The invention improves the available phase shift range by a factor of approximately 70% when compared to a standard 50 ohm to 50 ohm design, with comparable loading such as a single varactor coupled to each quadrature port.

Although the basic application of the invention is described in connection with the use of phase shifters and an RF signal-driven antenna, the technique can be used in a broader range of devices as well.

For example, the techniques disclosed herein can be extended to space fed antenna arrays. In such an implementation, the two-port phase shifters are replaced by single-port variable impedances, specifically ones that use a quarter wave transmission line of a lower characteristic impedance to affect a phase change.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
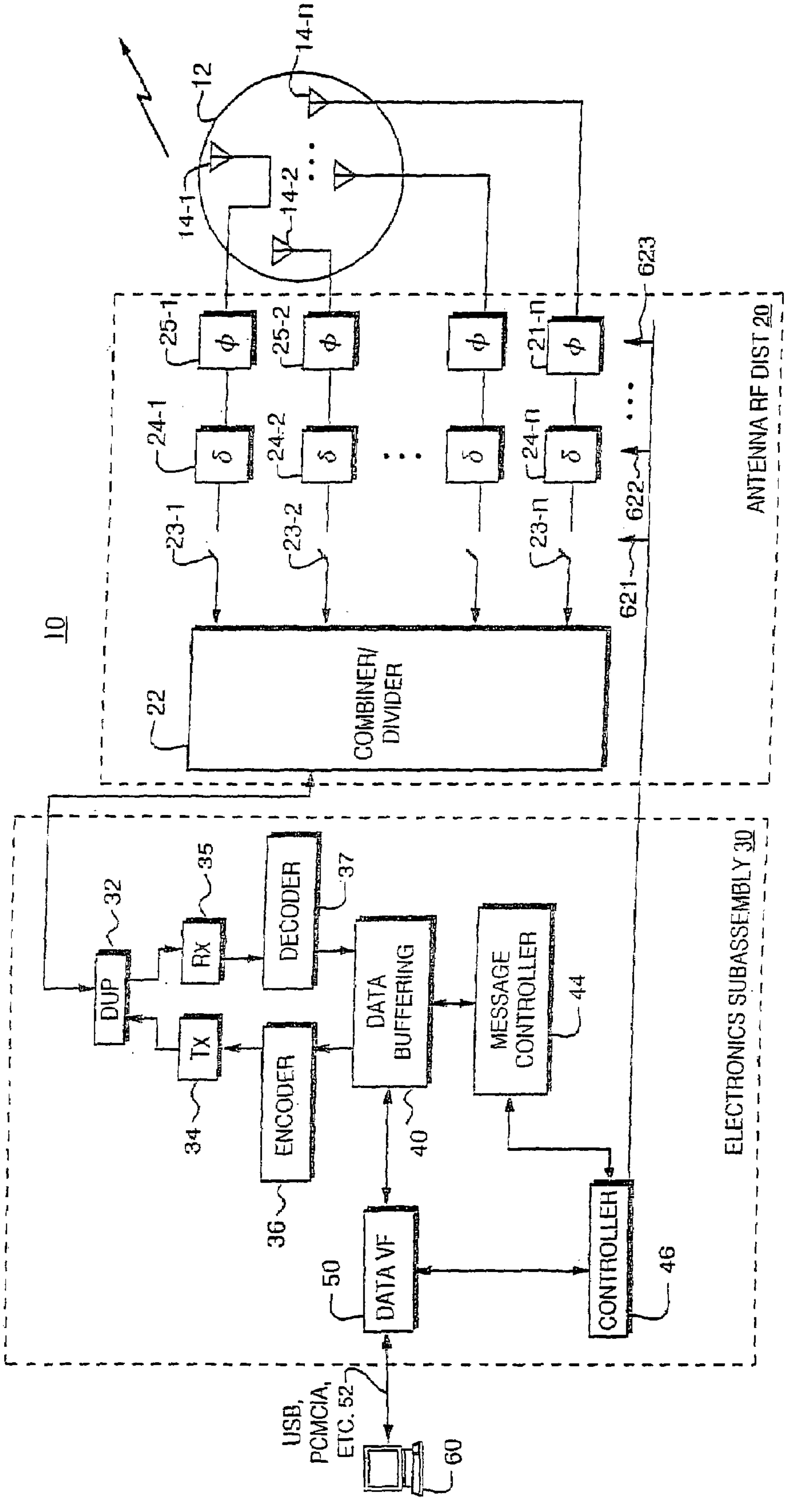
FIG. 1 is a block diagram of a portable access unit, such as may be used to provide wireless internet connectivity, with the unit having one more phase shifters implemented according to the invention.

Turning attention first to FIG. 1, there is shown a block diagram of one particular application of a phase shifter having improved phase shift range according to the invention. This device is a subscriber access unit 10 for a wireless communication system, and is seen to include an antenna array 12, antenna Radio Frequency (RF) sub-assembly 20, and an electronics sub-assembly 30. The subscriber access unit 10 may be used to provide wireless data connectivity such as between the user of a laptop computer 60 and data networks such as the Internet. A wireless base station unit (not shown in FIG. 1) provides network connectivity through internetwork switches or routers. In the typical scenario, a number of subscriber access units 10 are located within the area surrounding a base station and are serviced by the common base station. However, other arrangements are possible.

Before, turning attention to the phase shifter 25 in particular, it will be instructive to understand how the subscriber access unit 10 operates in general. Wireless signals arriving from the base station are first received at the antenna array 12 which consists of a number of antenna elements 14-1, 14-2, . . . , 14-N. The signals arriving at each antenna element are fed to an RF subassembly 20, including, for example, a phase shifter 25, delay 24, and/or switch 23. There is an associated phase shifter 25, delay 24, and/or switch 23 associated with each antenna element 14.

The signals are then fed through a combiner divider network 22 which typically adds the vector voltages in each signal chain providing the summed signal to the electronics sub-assembly 30.

In the transmit direction, radio frequency signals provided by the electronic sub-assembly 30 are fed to the combiner divider network 22. The signals to be transmitted follow through the signal chain, including the switch 23, delay 24, and/or phase shifter 25 to a respective one of the antenna elements 14, and from there are transmitted back towards the base station.

In the receive direction, the electronics sub-assembly 30 receives the radio signal at the duplexer/filter 32 which provides the received signals to the receiver 35. The radio receiver 35 provides a demodulated signal to a decoder circuit 37 that removes the modulation coding. For example, such decoder may operate to remove Code Division Multiple Access (CDMA) type encoding which may involve the use of pseudorandom codes and/or Walsh codes to separate the various signals intended for particular subscriber units, in a manner which is known in the art. The decoded signal is then fed to a data buffering circuit 40 which then feeds the decoded signal to a data interface circuit 50. The interface circuit 50 may then provide the data signals to a typical computer interface such as may be provided by a Universal Serial Bus (USB), PCMCIA type interface, serial interface or other well-known computer interface that is compatible with the laptop computer 60. A controller 46 may receive and/or transmit messages from the data interface to and from a message interface circuit 44 to control the operation of the decoder 37, encoder 36, the tuning of the transmitter 34 and receiver 35. This may also provide the control signals 62 associated with controlling the state of the switches 23, delays 24, and/or phase shifters 25. For example, a first set of control signals 62-3 may control the phase shifter states such that each individual phase shifter 25 imparts a particular desired phase shift to one of the signals received from or transmitted by the respective antenna element 14. This permits the steering of the entire antenna array 12 to a particular desired direction, thereby increasing the overall available data rate that may be accomplished with the equipment. For example, the access unit 10 may receive a control message from the base station commanded to steer its array to a particular direction and/or circuits associated with the receiver 35 and/or decoder 37 may provide signal strength indication to the controller 46. The controller 46 in turn, periodically sets the values for the phase shifter 25.

As mentioned above, of particular interest to the present invention is the construction of the phase shifter 25.

Figure 2:
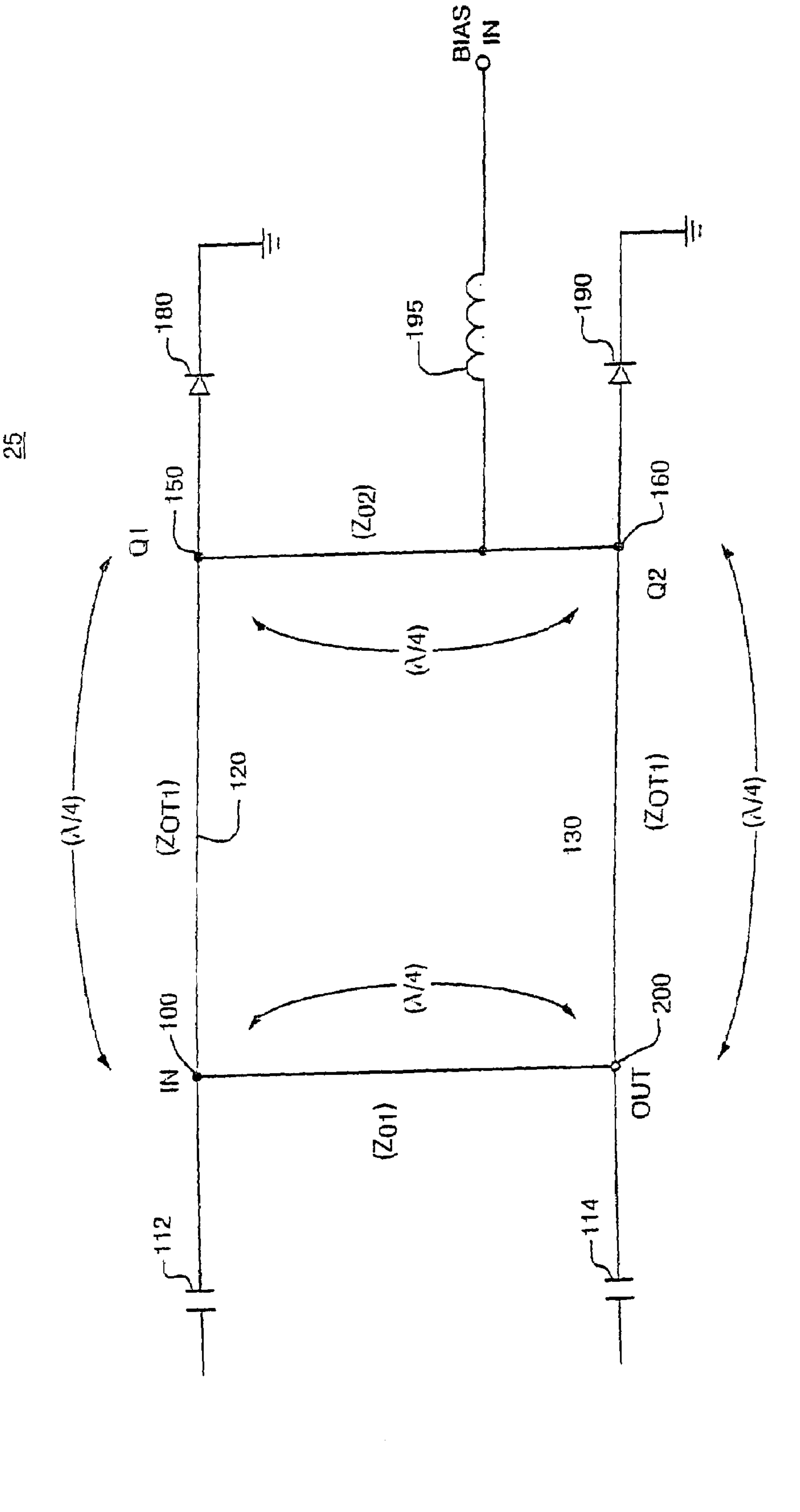
FIG. 2 is a circuit diagram for a varactor based quadrature port phase shifter implemented according to the invention.

Turning now to FIG. 2, there is shown a more detailed circuit diagram of the preferred embodiment of the phase shifter 25 as a four port device. In particular, the phase shifter 25 includes an input port (IN) 100, an output port (OUT) 200, a first quadrature port (Q1) 150, and a second quadrature port (Q2) 160. The input port 100 and output port 200 have an associated characteristic impedance $Z_{O1}$. Similarly, the quadrature ports 150 and 160 have associated with them a characteristic impedance $Z_{O2}$. Coupled between the input port 100 and quadrature port 150 is an impedance transformer 120. The impedance transformer provides for a transformation from the characteristic impedance $Z_{O1}$ between the input port 100 and the output port 200 to the characteristic impedance $Z_{O2}$ between the quadrature ports 150 and 160. As will be understood shortly, in connection with the description of FIG. 3, the impedance transformer 120 is implemented using a strip of transmission line of the appropriate length. Similarly, an impedance transformer 130 is connected between the second quadrature port 160 and the output port 200. It is these impedance transformers 120 and 130 that provide for increased phase range in connection with the novel aspects of the present invention.

Figure 3:
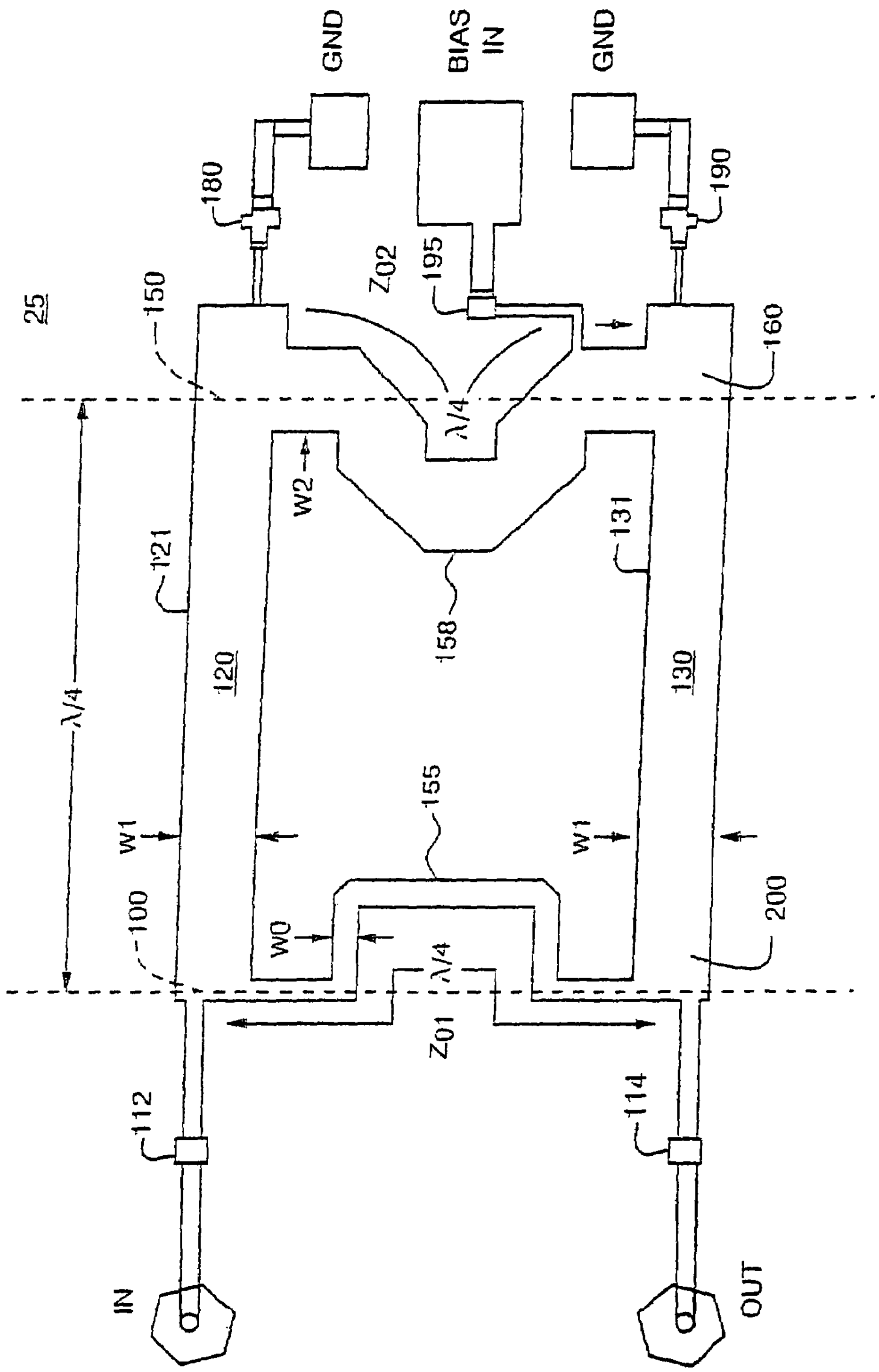
FIG. 3 is a circuit layout for one implementation of the phase shifter showing the impedance transformers coupled between the input and quadrature port and quadrature port and output.

A varactor diode 180 is connected between the first quadrature port 150 and a ground reference potential; similarly, a second varactor diode 190 is connected between the second quadrature port 160 and the ground reference as well. A bias input voltage representing the signal 62-3 which was provided in the description of FIG. 1 to control the phase shift imported by the phase shifter 25 is applied to the quadrature ports 150 and 160. An RF blocking inductor 195 may be typically disposed in the bias input. In addition, blocking capacitors 112 and 114 may be applied to the input port 100 and output port 200 to prevent the introduction of direct current signals beyond the phase shifter circuit 25. In the preferred embodiment, the four port coupler arrangement is a one-quarter wave device having a line length of λ/4. One implementation of such a coupler is a so-called branch line coupler, as shown in FIG. 3. FIG. 3 is a circuit layout diagram illustrating a planar implementation of the invention. Particular circuit elements, including the input blocking capacitors 112 and 114, varactor diodes 180 and 190, and RF blocking inductor 195 are implemented using known planar circuit techniques. In this implementation, the impedance transformer circuits 120 and 130 are provided by sections of transmission line 121 and 131 having a length equal to one-quarter wavelength of the desired operating frequency. The distance λ/4 associated with the impedance transformer 120 and 130 is as measured from a center line of the center line C of each end of the circuit structure.

The width, $w_1$, associated with the impedance transformers 120 and 130 is selected to provide the appropriate transformation from the characteristic input impedance $Z_{O1}$ across the input port 100 and output port 200 to the characteristic impedance $Z_{O2}$ associated across the quadrature ports 150 and 160. The formula is $$Z_{OT}=\sqrt{Z_{O1}Z_{O2}}/F_{QC}$$

where $F_{QC}$ is a quadrature hybrid factor value that depends upon the hybrid coupler design. In the case of a branch line coupler, the $F_{QC}$ factor is known to the practitioners to be $\sqrt{2}$.

In this embodiment, the impedance transformers 120 and 130 have a width, $w_1$, that approximately provides a 22 ohm impedance to current flow.

Coupling between the input port 100 and output port 200 is provided by a straight branch line 155, in this embodiment. The branch line 155 has a width, $w_0$, that provides the desired characteristic impedance; here this impedance is 50 ohms. Also in this embodiment, another one quarter wavelength branch line 158 provides coupling between the quadrature ports 150 and 160. This branch line 158 has a width, $W_2$, that provides the desired characteristic impedance between the quadrature ports of 20 ohms. The branch lines 155 and 158 may be straight or follow a serpentine path as is illustrated. The serpentine path permits the overall dimension of the phase shifter 25 to be less than would otherwise be required; for in the preferred embodiment, the overall length of each of the branch lines 155 and 158 is λ/4.

By changing the voltage applied to the bias terminal, the reactance of the varactors 180 and 190 changes. This provides a change in the phase shift imparted by the pair of varactors 180 and 190, in turn effecting a phase change at the quadrature ports 150 and 160. This results in an insertion phase shift being evident in the signal going from the input port to the output port.

Figure 4B:
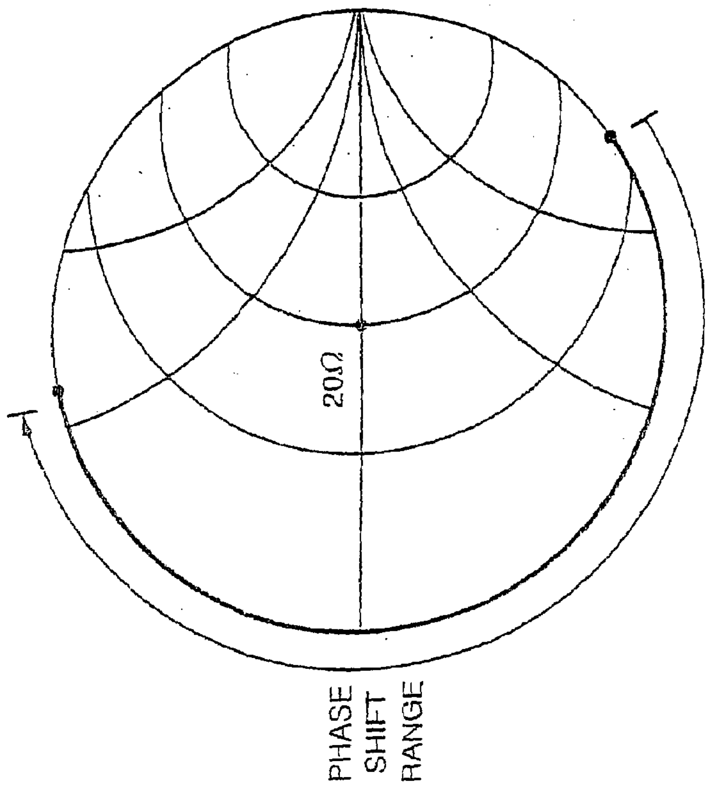
FIGS. 4A and 4B, are respectively, Smith chart diagrams for respectively a prior art phase shifter and the present invention, showing the increase in available phase shift range.
Figure 4A:
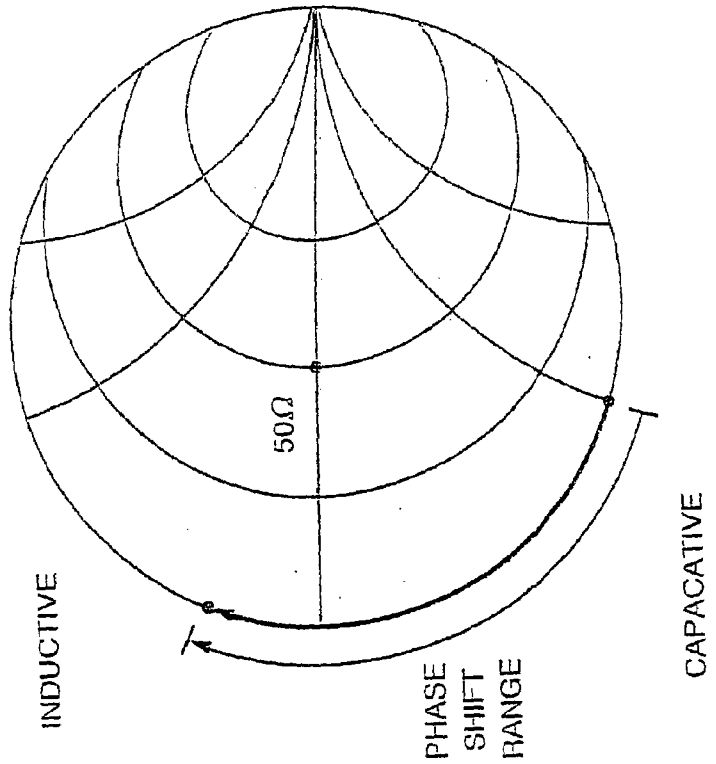
FIG. 4A (PRIOR ART)

A dramatic increase in the amount of available phase shift range is available with the introduction of the impedance transformers 120 and 130. This difference is illustrated by the Smith charts in FIGS. 4A and 4B. FIG. 4A represents a Smith chart for a prior art phase shifter in which the characteristic impedance between the input and output ports and across the quadrature ports are each set at 50 ohms. Such an implementation provides a phase shift range as illustrated, for example, of approximately 80°, going from the inductive zone to the capacitive zone. The prior art circuit implementation made the assumption that matching the characteristic impedance at both ends of the four port device provides for the best performance. However, with the present invention, it is clear that by dropping the characteristic impedance across the quadrature ports to 20 ohms, as shown in FIG. 4B, the overall available phase shift range has been marketedly increased such as, for example, to a range of approximately 200°.

The narrow line widths on either side of each varactor are designed in to provide added inductance to the varactors, so that when the varactors are under bias, they can exhibit both inductive and capacitive properties. This allows the phase shift to vary over a broader range of degrees in both the capacitive and inductive zones about the 180° point, as shown in FIG. 4B.

Figure 5:
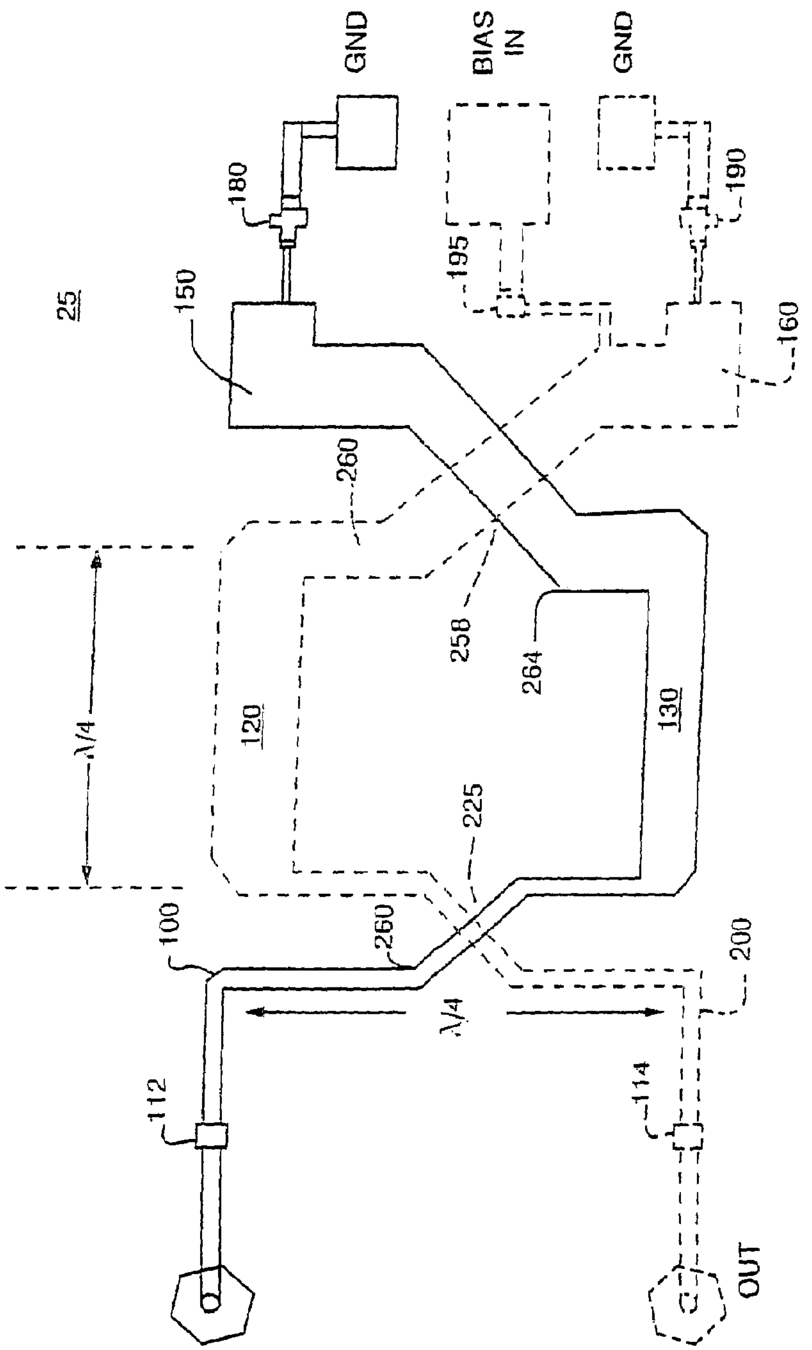
FIG. 5 is a circuit layout for an alternate embodiment of the invention using coupled lines.

FIG. 5 illustrates an alternative arrangement for the invention making use of a so-called cross line face-coupled coupler. In this embodiment, coupling between the input and output ports is provided by a pair of transmission lines in a cross coupled orientation, as shown at 225 between the 50 ohm input port 100 and 50 ohm output port 200. Similarly, a pair of cross coupled lines may be provided to implement the coupling between the 20 ohm quadrature ports 150 and 160, as illustrated at 258. Cross-coupling is implemented by forming one set of the circuit traces and components on a first layer of a printed circuit board, as shown with the solid lines, and a second set of traces and components on another layer of the printed circuit board, as shown with the dashed lines. As is know to those of skill in the art, each pair of cross-coupled lines provides a 6 dB directional coupler. Two pairs of these coupled lines in tandem make up a 3 dB coupler, or a hybrid, which has the same properties as the branch line coupler.

The transformers 120 and 130 are one quarter wavelength long. The characteristic impedance of the transformers are 32 ohms, which is different from the previous branch line example. The difference is due to the fact that the quadrature hybrid factor, $F_{QC}$, in the case of the crossed line coupler is one (1), instead of $\sqrt{2}$.

Using the same concepts discussed above, a simple reflection phase modifier can also have its phase change range increased. The phase modifier can be made adjustable by including a varactor, as before; however, this circuit is ideally used with a phased array composed of space fed antenna elements. This type of reflection phase modifier still provides improved, fine resolution phase shifts, such that arrays of antennas can use them to implement a low-loss adaptive beamforming array.

Figure 6:
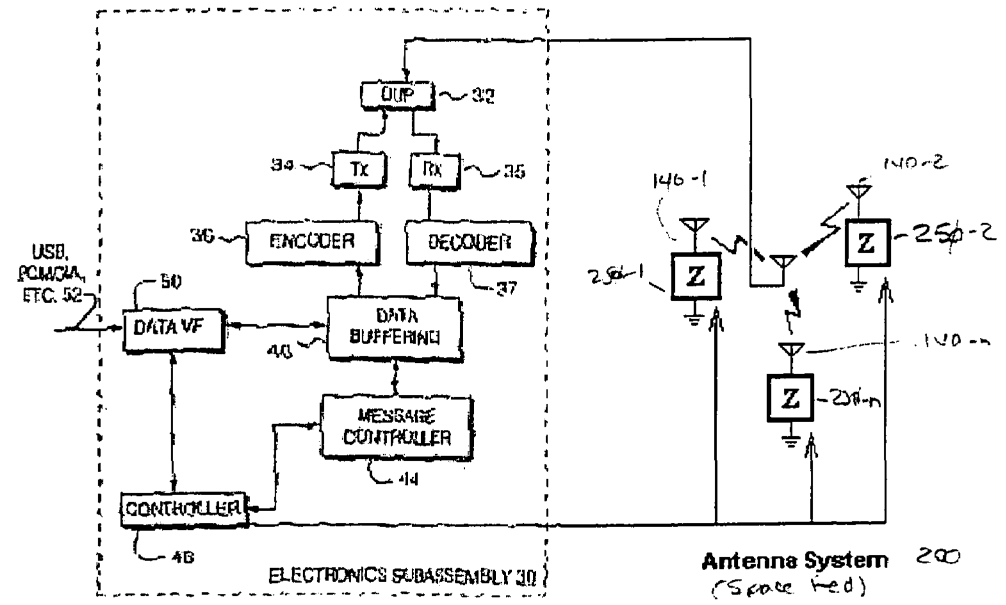
FIG. 6 illustrates a space fed array where the phase shifters are instead implemented as single-port variable impedances that operate as phase reflectors.

A typical space fed phased array is shown in FIG. 6. The driving electronics assembly 30 is the same as for the embodiment of FIG. 1. The space fed phased array, however, now elements 140-1, 140-2, . . . **140-*n* which are fed via radiation (i.e, they are space fed), such as by using parasitic elements that can be controlled via a load. The load can make each element 140 either reflective or directive, such that each element 140 need not have separate driving signals. The combiner/divider 22 and switches 23** are thus eliminated.

Figure 7:
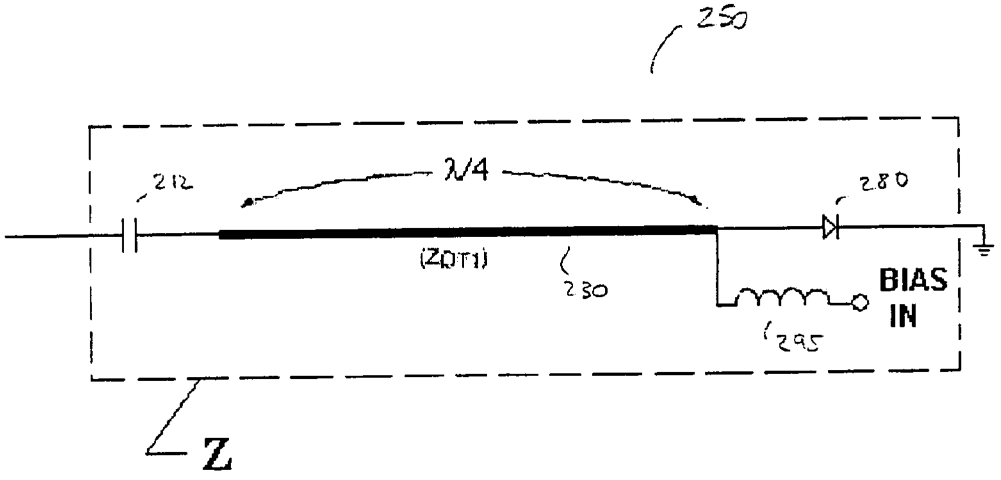
FIG. 7 illustrates the phase reflector in more detail.

In this embodiment, the phase shift device also changes from a two-port phase shifter 25 to a single port reflection phase modifier 250. A detailed diagram for such a reflection phase modifier 250 is shown in FIG. 7. It is a single port device, so the directional coupler is eliminated. It is otherwise similar to the phase shift device shown in FIG. 2, to the extent that a capacitor 212, transformer 230, varactor 280, and inductor 295 are still present.

The DC blocking capacitor 212 can be removed if the phase modifier 250 is used with a parasitic antenna element, such as element 140-1.

The transformer 230 is a quarter wave transmission line of lower characteristic impedance, $Z_{01}$. The essence of the concept behind imparting a phase change is thus still the same in the FIG. 7 embodiment as was in the FIG. 2 embodiment; namely, the quarter-wave transformer 230, with its low characteristic impedance, affects a phase change is affected as varactor 280 capacitance is increased. The concept explained earlier thus still holds true in the case of this simplified circuit.

The difference here is that the reflected phase is now seen at the single input port, whereas, before, in the case of the two-port phase shifter 25, it is returned to the second port, or the output port.

The implementation shown in FIGS. 6 and 7 thus extends the phase shift concept to space fed parasitic arrays, using a single port reflection phase shifter 250. A continuously variable phase shift, the amount of which is selected via the varactor 280, is provided over a resulting wider phase shift range. The use of single port reflection phase shifter 250, when compared to prior are discrete switching approaches, provides an improved beam shape for a single receiver system.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus for imparting a phase shift to a signal applied to a port, the circuit comprising:

the port being coupled to the signal, the port having a characteristic impedance;

a reference node; and an impedance transformer coupled between the port and the reference node, the impedance transformer transforming the characteristic impedance of the port to a lower impedance, to affect a phase shift of the signal at the port, the impedance transformer comprising a one-quarter wavelength section of a transmission line, the one-quarter wavelength section of the transmission line having a lower impedance than the port coupled to the signal, the reference node being coupled to a varactor diode, and an inductor being coupled between the varactor diode and the one-quarter wavelength section of the transmission line.

2. An apparatus as in claim 1, further comprising the port and the reference node being coupled by a coupling, the coupling being provided by a branch line having a desired impedance.

3. An apparatus as in claim 2, wherein the impedance transformer is implemented as the one-quarter wavelength section of transmission line having a desired impedance, and wherein the desired impedance is in a range that includes about 32 ohms.

4. An apparatus as in claim 2, wherein the port is coupled to a space fed antenna element.

5. An apparatus as in claim 1, wherein the varactor diode is coupled to the reference node by a second one-quarter wavelength section of transmission line.

6. An apparatus as in claim 5, wherein an input bias voltage is applied to the varactor diode.

7. An apparatus as in claim 6, wherein the voltage of the input bias voltage determines an amount of phase shift imparted by the phase shifter.

8. An apparatus as in claim 1, wherein at least one varactor diode is coupled between the impedance transformer and the reference node by a branch line.

9. An apparatus as in claim 1, wherein the characteristic impedance is 50 ohms.

10. An apparatus as in claim 1, wherein the characteristic lower impedance is 20 ohms.

11. An apparatus as in claim 1, further comprising a blocking capacitor coupled to the one-quarter wavelength section of the transmission line.

12. An apparatus as in claim 11, wherein the blocking capacitor is a DC blocking capacitor.

13. An apparatus as in claim 12, wherein the one-quarter wavelength section of the transmission line having the low characteristic impedance affects a phase change as a varactor diode capacitance is increased.

14. An apparatus as in claim 12, wherein a reflected phase is received at the port.

15. A space fed antenna array comprising:

a plurality of antenna elements each being coupled to an radio-frequency subassembly, the radio-frequency subassembly comprising a phase shifter, the phase shifter comprising:

a port coupled to the signal from at least one of the plurality of antenna elements, the port having a characteristic impedance;

a reference node; and an impedance transformer coupled between the port and the reference node, the impedance transformer transforming the characteristic impedance of the port to a lower impedance, to affect a phase shift of the signal at the port, the impedance transformer comprising a one-quarter wavelength section of a transmission line, the one-quarter wavelength section of the transmission line having a lower impedance than the port coupled to the signal, the reference node being coupled to a varactor diode, and an inductor being coupled between the varactor diode and the one-quarter wavelength section of the transmission line.

16. A space fed antenna array according to claim 15, wherein the one-quarter wavelength section of the transmission line has a desired impedance, and wherein the desired impedance is in a range that includes about 32 ohms.

17. A space fed antenna array according to claim 15, wherein an input bias voltage is applied to the varactor diode.

18. A space fed antenna array according to claim 17, wherein the voltage of the input bias voltage determines an amount of phase shift imparted by the phase shifter.

19. A space fed antenna array according to claim 17, further comprising a blocking capacitor coupled to the one-quarter wavelength section of the transmission line.

20. A space fed antenna array according to claim 15, wherein a load is applied to the plurality of antenna elements, the load being configured to make the antenna elements reflective or directive.

* * * * *

UNITED STATES PATENT AND TRADEMARK OFFICE

CERTIFICATE OF CORRECTION

PATENT NO. : 7,205,866 B2
APPLICATION NO. : 11/169173
DATED : April 17, 2007
INVENTOR(S) : Bing Chiang It is certified that error appears in the above-identified patent and that said Letters Patent is hereby corrected as shown below:

IN THE SPECIFICATION

At column 2, line 3, before the words “a unique”, insert --on--.

At column 3, line 3, after the word “one”, insert --or--.

At column 7, line 17, after the word “prior”, delete “are” and insert therefor --art--.

IN THE CLAIMS

At claim 15, column 8, line 22, after the words “coupled to” delete “an” and insert therefor --a--.

Signed and Sealed this

Twenty-fifth Day of December, 2007

JON W. DUDAS
*Director of the United States Patent and Trademark Office*